United States Patent
Oh et al.

(10) Patent No.: US 6,810,047 B2
(45) Date of Patent: Oct. 26, 2004

(54) WAVELENGTH TUNABLE EXTERNAL RESONATOR LASER USING OPTICAL DEFLECTOR

(75) Inventors: Kwang Ryong Oh, Daejon-Shi (KR); Myung Lae Lee, Busan-Shi (KR); Hyun Soo Kim, Daejeon-Shi (KR); Jung Ho Song, Jeju-Shi (KR); Kang Ho Kim, Daejeon-Shi (JP)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 10/185,100

(22) Filed: Jun. 27, 2002

(65) Prior Publication Data

US 2003/0112838 A1 Jun. 19, 2003

(30) Foreign Application Priority Data

Dec. 15, 2001 (KR) ........................................ 2001-79683

(51) Int. Cl.[7] ................................................ H01S 3/10
(52) U.S. Cl. ............................. 372/20; 372/16; 372/54; 372/100; 372/102
(58) Field of Search ............................. 372/20, 16, 54, 372/102, 23; 356/319, 514, 301, 369; 359/565

(56) References Cited

U.S. PATENT DOCUMENTS

| | | | | |
|---|---|---|---|---|
| 3,614,235 A | * | 10/1971 | Munnerlyn | 356/514 |
| 4,166,697 A | * | 9/1979 | Ito et al. | 356/319 |
| 4,229,710 A | * | 10/1980 | Shoshan | 372/102 |
| 4,494,235 A | * | 1/1985 | Guch et al. | 372/23 |
| 4,884,119 A | | 11/1989 | Miller | |
| 5,371,586 A | * | 12/1994 | Chau | 356/301 |
| 5,550,850 A | * | 8/1996 | Lee et al. | 372/16 |
| 5,715,091 A | * | 2/1998 | Meyers | 359/565 |
| 6,026,100 A | | 2/2000 | Maeda | |
| 6,049,554 A | * | 4/2000 | Lang et al. | 372/20 |
| 6,449,043 B2 | * | 9/2002 | Aspnes et al. | 356/369 |
| 6,507,597 B1 | * | 1/2003 | Graindorge et al. | 372/102 |

OTHER PUBLICATIONS

Widely tunable external cavity diode laser based on a MEMS elctrostatic rotary actuator by J. Berger et al.

* cited by examiner

*Primary Examiner*—Don Wong
*Assistant Examiner*—Dung Nguyen
(74) *Attorney, Agent, or Firm*—Blakely Sokoloff Taylor & Zafman

(57) ABSTRACT

The present invention relates to an optical deflector driven by an electrical signal, and a wavelength tunable external resonator using the same. The optical deflector of a triangle shape, capable of controlling the refractive index of a beam depending on the electrical signal, is positioned between a reflection mirror and a diffraction grating in a Littman-Metcalf mode external resonator or between a lens and the diffraction grating in a Littrow mode external resonator. Thus, even with the reflection mirror and the diffracting grating fixed, the refractive index of the beam generated from a laser diode can be controlled by adjusting the electrical signal applied to the optical deflector, so that beam having a specific wavelength can be focused and the wavelength can be rapidly and consecutively tuned.

16 Claims, 11 Drawing Sheets

WAVELENGTH TUNABLE EXTERNAL RESONATOR LASER USING OPTICAL DEFLECTOR

BACKGROUND OF THE INVENTION

1. Field of the Invention

The invention relates generally to a wavelength tunable external resonator laser using an optical deflector driven by an electrical signal and can be applied in the external resonator laser of a Littman-Metcalf mode or a Littrow mode.

2. Description of the Prior Art

An external resonator for tuning a single mode light from a laser diode or other light sources having a predetermined range of bandwidth to select a specific wavelength, includes a Littman-Metcalf mode external resonator and a Littrow mode external resonator. A method by which a specific wavelength is selected using these types of the resonators has been applied to a dye laser technology that is widely researched in the field of a spectroscopy.

Figure 1:
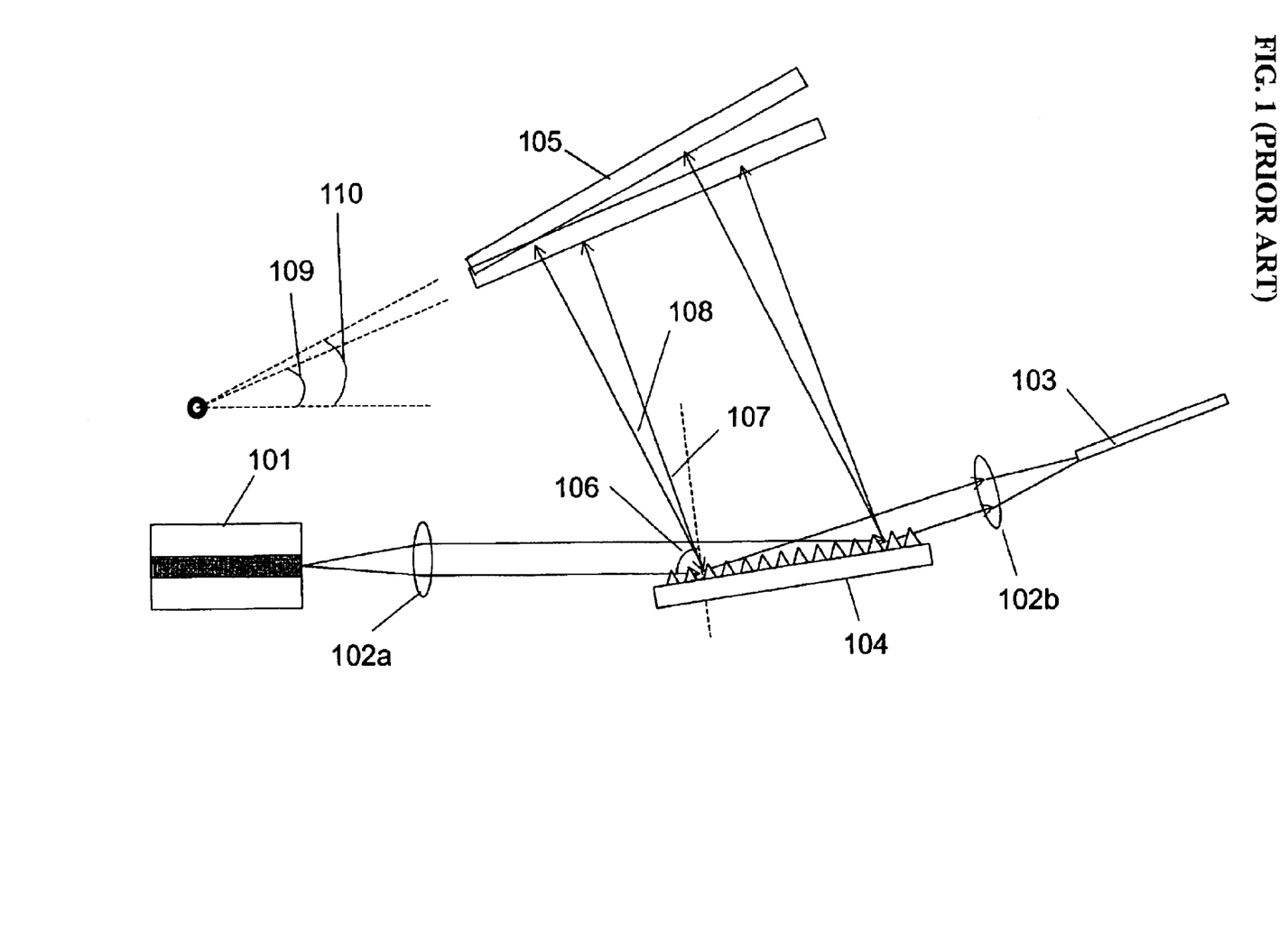
FIG. 1 shows a conventional Littman-Metcalf mode external resonator.

FIG. 1 is a structure of a conventional external resonator of a Littman-Metcalf mode.

Referring now to FIG. 1, the external resonator of a Littman-Metcalf mode includes a laser diode 101 having a wide band of wavelength, a first lens 102a for making the beam from the laser diode 101 in parallel, a diffraction grating 104 for diffracting the parallel beam and a reflection mirror 105 for reflecting the diffracted beam. The beam generated from the external resonator laser is reflected against a diffraction grating 104 and focused on an optical fiber 103 via a lens 102b.

If a beam is generated from the laser diode 101, the beam is converged in parallel by the first lens 102a. Then, the parallel beam is diffracted toward the reflection mirror 105 by means of the diffraction grating 104. At this case, the angle of the reflection mirror 105 toward the diffraction grating 104 is controlled by a mechanical equipment (not shown). Thereby, the reflection mirror 105 reflects specific wavelengths that are vertically incident from the wavelengths incident to the reflection mirror 105, to the diffraction grating 104. The beam reflected by the reflection mirror 105 is diffracted by the diffraction grating 104, so that it returns to the laser diode 101 via the first lens 102a.

As shown in FIG. 1, if the reflection mirror 105 is positioned at a first angle 109, a first beam 107 of a given wavelength is vertically incident to the reflection mirror 105 and is then reflected toward the diffraction grating 104. Further, if the reflection mirror 105 is positioned at a second angle 110, a second beam 108 having a different wavelength is vertically incident to the reflection mirror 105 and is then reflected toward the diffraction grating 104. As a result, the wavelength of the beam returning to the laser diode 101 is different depending on the angle in which the reflection mirror 105 is positioned. The wavelength is also tuned depending on the angle of the reflection mirror.

As above, the external resonator of the Littman-Metcalf mode controls the angle of the reflection mirror to tune the wavelength. However, the external resonator of the Littrow mode controls the angle of the diffraction grating to tune the wavelength.

Figure 2:
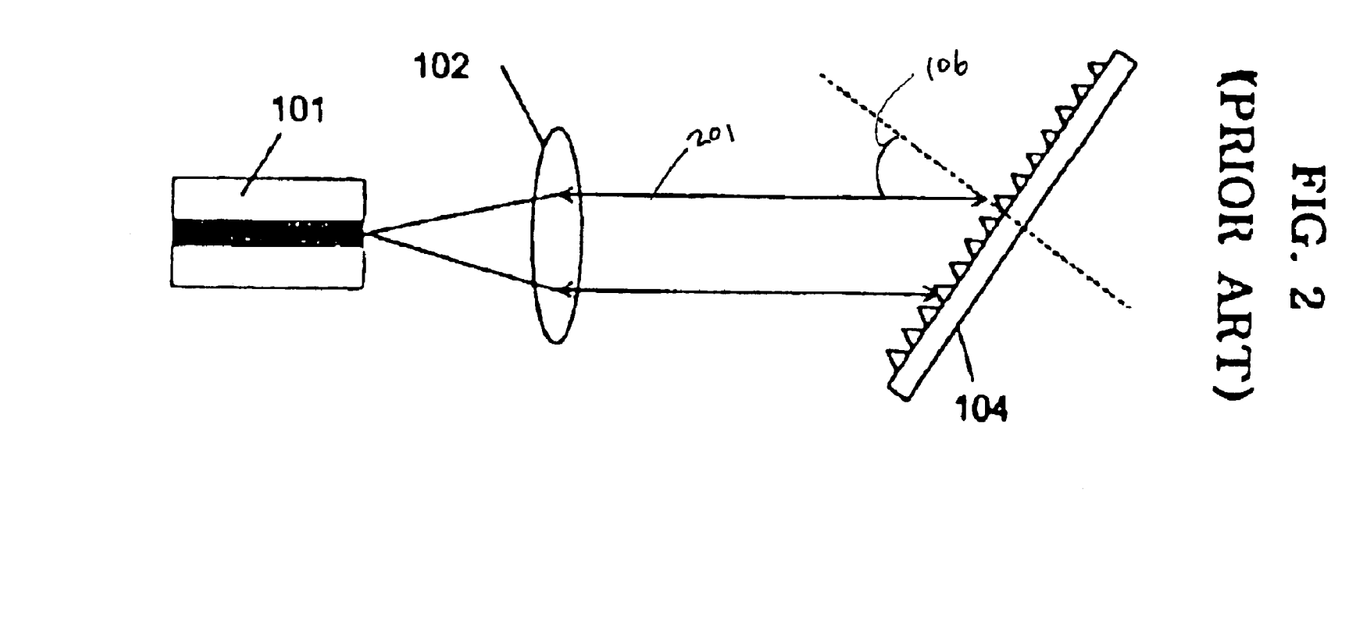
FIG. 2 shows a conventional Littrow mode external resonator.

FIG. 2 is a structure of a conventional external resonator of a Littrow mode.

Referring now to FIG. 2, the external resonator of the Littrow mode is similar in structure to the external resonator of the Littman-Metcalf mode. Only different is that the external resonator of the Littrow mode does not use the reflection mirror but rotate the diffraction grating 104 to tune the wavelength.

If a beam is generated from the laser diode 101, the beam 201 is in parallel converged by the lens 102. A beam having a specific wavelength from the parallel beams is diffracted depending on the angle 106 of the diffracting grating 104 and is then reflected toward the lens 102. The beam 201 reflected by the diffracting grating 104 returns to the laser diode 101 via the lens 102.

As a result, the wavelength of the beam 201 returning to the laser diode 101 is different depending on the angle in which the diffracting grating 104 is positioned. That is, the wavelength of the beam is tuned depending on the rotation of the diffracting grating 104.

As above, the external resonator tunable laser of the Littman-Metcalf or Littrow mode mechanically rotates the reflection mirror or the diffraction grating and then control the angles of them to select a beam of a specific wavelength. Therefore, as the reflection mirror or the diffraction grating must be mechanically finely rotated, there are problems that the stability of a laser is low, the size of the apparatus is great, the tunable speed is low and the manufacturing cost is high. In other words, the conventional resonator requires a rotation mechanical apparatus having a high accuracy in order to select a specific wavelength and is low in a tunable speed.

Various types of resonators that have been proposed to tune the wavelengths will be now described.

The external resonator laser structure includes two reflection mirrors fixed at both sides of the resonator centering on a laser medium capable of oscillating a plurality of wavelengths so that they can have a rapid variable speed of about 1 ms, and a reflection mirror linearly and in multiple arranged, for varying the length of the resonator by means of PZT.

As the reflection mirror and diffraction grating are simultaneously rotated centering on a given rotation axis located near the laser, the rotation for controlling the diffraction angle and the length of the resonator can be simultaneously controlled. Thus, an external resonator light source can consecutively select a wavelength without hopping a mode.

There is a high-speed wideband wavelength tunable laser system. The laser system includes various tunable components controlled via a microprocessor. The tunable components, being birefringence crystal body representing an electrical optical effect when applied with an electric field, consist of more than two tunable components. At this case, the two tunable components perform a coarse control and a fine control, respectively.

There is a laser resonator including more than two reflection components, positioned at both sides of the resonator, two curve overlapping mirrors, and couple-type reflection mirrors positioned at its output portion. A laser crystal body is installed at a reflection path within the laser resonator. A component for distributing the wavelength such as a prism is positioned at the reflection path within the resonator between one of the overlapping mirrors and the reflection components at its both ends, in order to tune and oscillate at least one wavelength within an expected range of the wavelength. At this time, tuning of the oscillated wavelength is made by a fine rotation of the reflection component.

There is an external resonator structure for tuning the wavelength using an electrical signal without mechanical movement. The external resonator includes two mirrors at its both ends, a crystal body as a laser medium positioned at the center of the mirror, and a crystal body for selecting the wavelength in a piezoelectric unit driven by a RF source as a sound wave input. Therefore, the grating is not moved in the external resonator since the crystal body installed at the piezoelectric unit driven by the RF source.

Also, there is a wavelength tunable laser diode rotates the grating using a stepper motor and controls it using a microprocessor. Further, there is a wavelength tunable laser diode moves the reflection mirror and diffraction grating by means of an actuator using a MEMS technology.

The above-mentioned conventional technologies have advantages in the structure and performance but have some problems. Major problem in the prior arts are as follows: they require mechanical movement and have a narrow wavelength tunable range, and the module size of them could not be miniaturized. In other words, there is a need for a new technology having a spectroscopy the wavelength of which is required to be tuned, a wide tunable range of the wavelength in a WDM optical communication, and a light source having the stability, miniaturization and a rapid tunable speed.

SUMMARY OF THE INVENTION

The present invention is contrived to solve the above problems and an object of the present invention is to provide a wavelength tunable external resonator using an optical deflector, which made of a medium capable of controlling the refractive index using an electrical signal in an external resonator of a Littman-Metcalf or Littrow mode is positioned between a reflection mirror and a diffraction grating or between a lens and the diffraction grating in order to control the angle along which a beam travels, so that the wavelength can be consecutively tuned at a rapid speed and the device can be stably driven.

In order to accomplish the above object, an optical deflector according to the present invention, is characterized in that it comprises a p/n junction is formed at a portion of a triangle shape on a substrate of a slab waveguide that is formed using materials capable of forming the slab waveguide such as InP or GaAs, whereby when a beam traveling through the slab waveguide passes through the triangle shape portion of the p/n junction, a refractive angle of the beam is controlled by variations in the density of a carrier in the slab waveguide layer or variations in the refractive index by an photoelectric effect depending on injection of current or application of voltage into/to the p/n junction.

A wavelength tunable external resonator capable of tuning a wavelength using an electrical signal by use of the optical deflector mentioned above according to another embodiment of the present invention, is characterized in that it comprises a light source for emitting beams of various wavelengths; a lens for making the beams in parallel; a diffraction grating for diffracting the parallel beams; a reflection mirror for reflecting an incident beam; and an optical deflector positioned between the diffracting grating and the reflection mirror, for refracting beams among the beam incident from the diffracting grating depending on the electrical signal and then vertically making a beam of a specific wavelength incident to the reflection mirror, whereby the beam vertically reflected by the reflection mirror is focused on the light source.

The optical deflector may be positioned in multiple stages between the diffracting grating and the reflection mirror, so that a beam having a specific wavelength is refracted by at least once wavelength to increase the tunable range.

A wavelength tunable external resonator capable of tuning a wavelength using an electrical signal by use of the optical deflector mentioned above according to another embodiment of the present invention, is characterized in that it comprises a light source for emitting beams of various wavelengths; a lens for making the beams in parallel; a diffraction grating for diffracting the parallel beams; a reflection mirror for reflecting an incident beam; and an optical deflector positioned between the lens and the diffraction grating, for refracting beams among the beam incident from the lens depending on the electrical signal and then making a beam of a specific wavelength directly reflecting from the diffraction grating, whereby the beam directly reflected is focused on the light source.

The optical deflector may be positioned in multiple stages between the lens and the diffracting grating, so that a beam having a specific wavelength is refracted by at least once wavelength to increase the tunable range.

A wavelength tunable external resonator capable of tuning a wavelength using an electrical signal by use of the optical deflector mentioned above according to another embodiment of the present invention, is characterized in that it comprises a diffraction grating of a concave shape, a lens for focusing the parallel light on an optical fiber; a reflection mirror; and a laser diode, the external resonator can be integrated on a semiconductor substrate.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings, in which like reference numerals are used to identify the same or similar parts.

Figure 3:
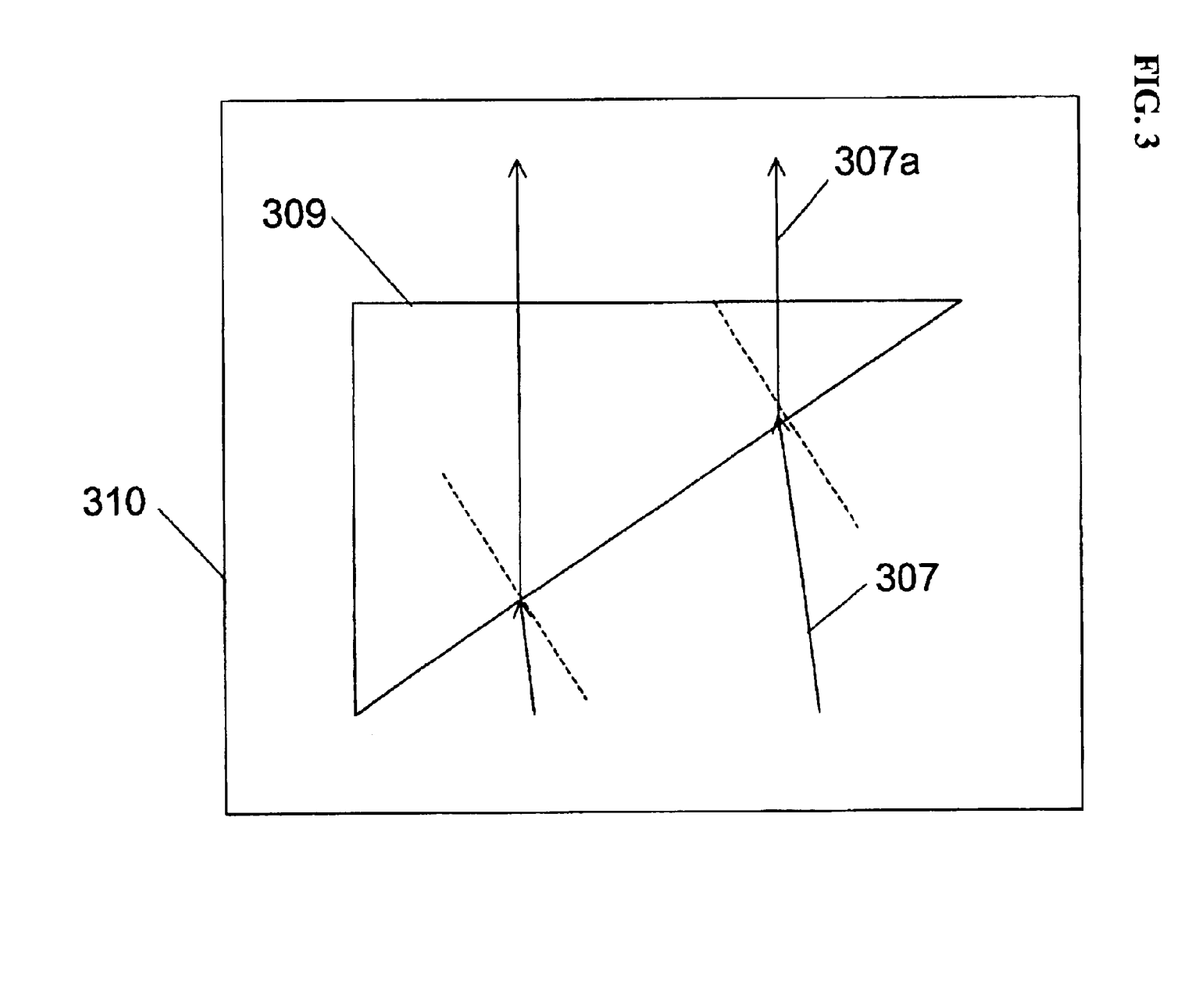
FIG. 3 is a conceptual diagram of an optical deflector a refractive index of which is control by an electrical signal, having a triangular structure.

FIG. 3 is a conceptual diagram of an optical deflector a refractive index of which is control by an electrical signal, having a triangular structure.

Major characteristic of the embodiment is to employ a phenomenon in which a beam 307a incident from surrounding part 310 is refracted according to Snell's law while passing through an optical deflector 309 of a triangle shape, as shown in FIG. 3 and become an outgoing beam 307 having a vertical direction from the base of the triangle. The optical deflector 309 has a p/n junction having a triangle shape on the substrate of the slab waveguide formed using materials such as InP, GaAs, etc. that can form a slab waveguide. The refractive index of the optical deflector 309 is changed by variations in the carrier density of the slab waveguide layer or photoelectric effect depending on voltage or current applied to the p/n junction. Thereby, when beam traveling through the slab waveguide passes through the triangle of the p/n junction, the refractive angle of the beam can be controlled using voltage or current applied to the p/n junction.

Figure 4:
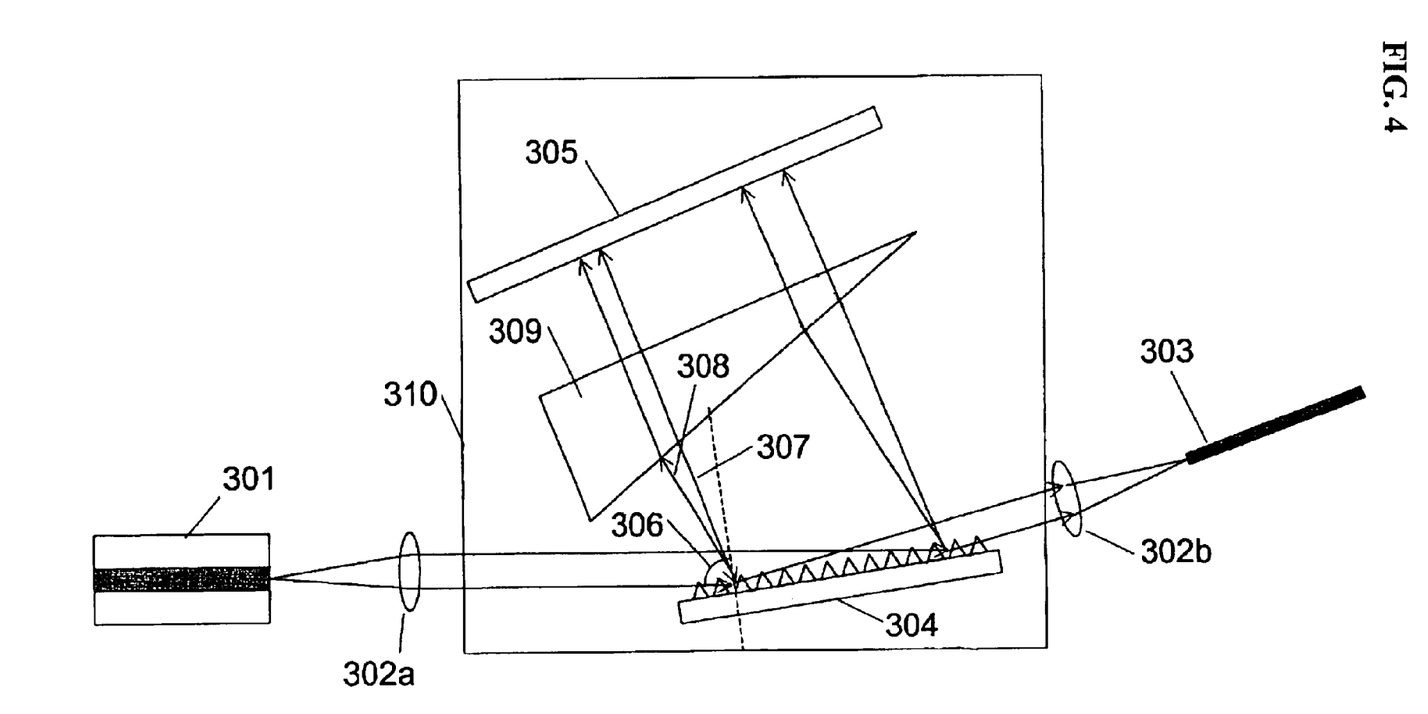
FIG. 4 shows a wavelength tunable external resonator using an optical deflector according to a first embodiment of the present invention.

FIG. 4 shows a wavelength tunable external resonator using an optical deflector according to a first embodiment of the present invention.

Referring to FIG. 4, the wavelength tunable external resonator includes a laser diode 301 being a Fabry-Perot semiconductor laser for generating beams of various wavelengths, which is a light source having a wide wavelength band, a first lens 302a for making the beam from the laser diode 301 in parallel, a diffracting grating 304 positioned to have a given angle 306 against the parallel beam, a reflection mirror 305 for reflecting the diffracted beam, and an optical deflector 309 positioned between the reflection mirror 305 and the diffracting grating 304 and having a triangle shape the refractive index of which can be controlled by an electrical signal. The beam generated from the external resonator laser is reflected from the diffraction grating 304 and is then focused on the optical fiber 303 via a second lens 302b.

In the above, the base of the optical deflector 309 having a triangle type is installed in parallel to the reflection mirror 305.

If a beam is generated from the laser diode 301, the beam is converged in parallel by means of the first lens 302a. Then, the parallel beam is diffracted toward the reflection mirror 305 by the diffraction grating 304. In case that the optical deflector 309 has the same refractive index to the surrounding part 310 since an electrical signal is not applied to the optical deflector 309 positioned between the reflection mirror 305 and the diffraction grating 304, there exists a first beam 307 of a specific wavelength reflected vertically to the reflection mirror 305, among the beams diffracted by the diffraction grating 304. At this time, the first beam 307 is reflected by the reflection mirror 305 and returns to the diffracting grating 304 through the optical deflector 309. Also, the first beam 307 is diffracted by the diffraction grating 304 and returns to the laser diode 301 through the first the lens 302a.

As shown in FIG. 4, if the refractive index of the optical deflector 309 is same to the surrounding part 310, the first beam 307 is vertically reflected from the reflection mirror 305 and then returns to the laser diode 301. However, if a second beam has a different diffraction angle, the second beam does not reflect vertically from the reflection mirror 305 and thus does not returns to the laser diode 301. In other words, the second beam has no resonating phenomenon therein. By controlling the refractive index of the optical deflector 309, the second beam 307 having a different wavelength among the beams generated from the laser diode 301 is vertically incident to the reflection mirror 305 to selectively return the second beam 307 to the laser diode 301, thus causing resonating operation.

A method of manufacturing the external resonator shown in FIG. 4 includes forming the diffraction grating 304 and the reflection mirror 305 on a semiconductor substrate such as InP, GaAs series, etc. made of the slab waveguide by means of an etching process, and forming a p/n junction of a triangle shape to which voltage or current can be applied. At this case, depending on voltage or current applied to the p/n junction, a beam of a specific wavelength can be vertically refracted toward the reflection mirror by variations in the density of carriers in the slab waveguide layer or photoelectric effect such as QCSE. In case of the slab waveguide made of InP and InGaAsP, it is known that the refractive index can be changed to 0.05 if the concentration of the carriers is changed to be about $5E10^{18}$ cm$^{-3}$. At this time, major components of the external resonator, the reflection mirror, the diffraction grating, an optical deflector for controlling the direction of diffraction, etc. can be integrated on a single chip using this method.

Figure 5:
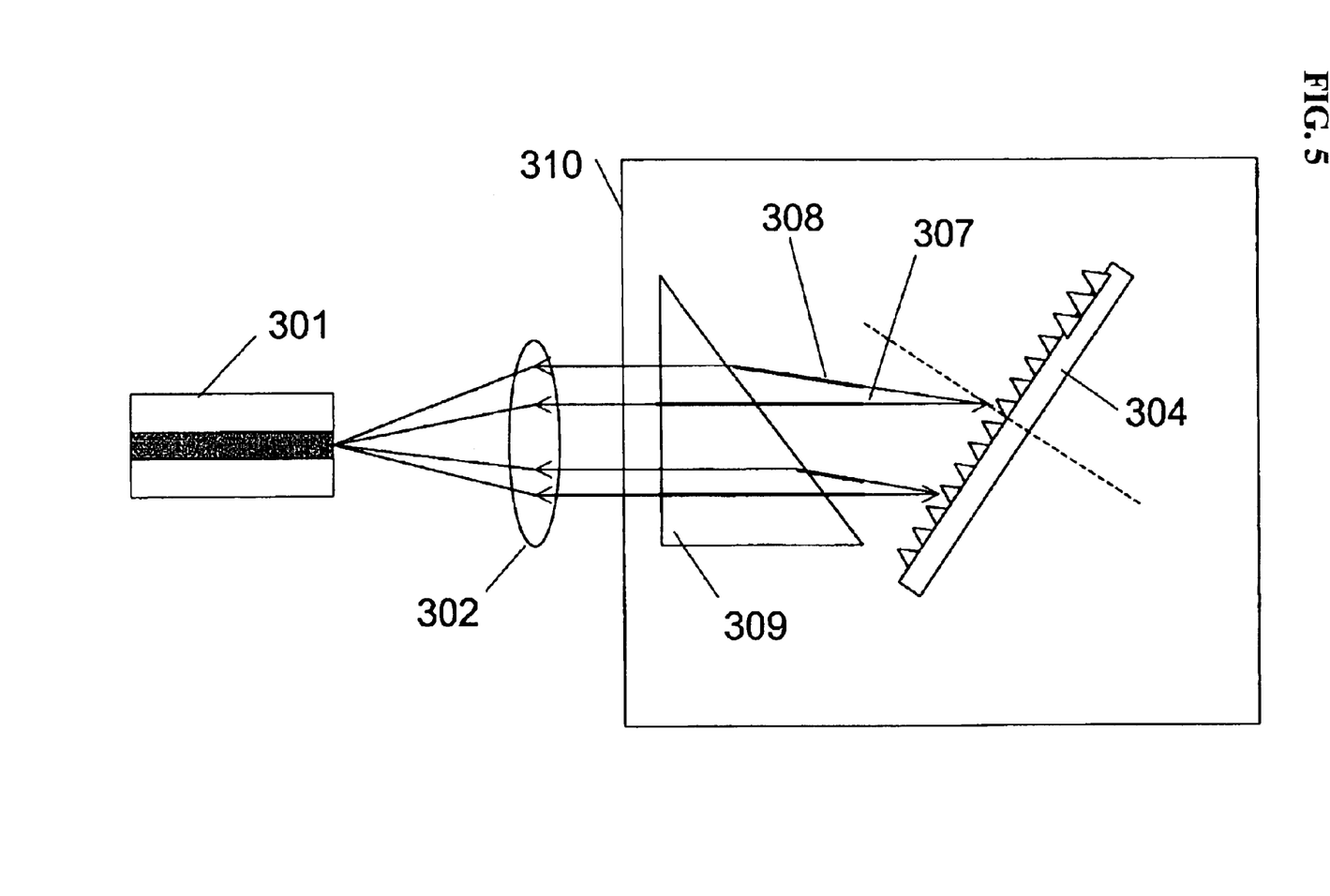
FIG. 5 shows a wavelength tunable external resonator using an optical deflector according to a second embodiment of the present invention.

FIG. 5 shows a wavelength tunable external resonator using an optical deflector according to a second embodiment of the present invention. It should be noted that the same components to those in FIG. 4 are assigned with same reference numerals.

Referring to FIG. 5, the wavelength tunable external resonator according to a second embodiment of the present invention is same to that of the Littrow mode external resonator shown in FIG. 2 except that the optical deflector 309 in FIG. 5 is positioned between the lens 302a and the diffraction grating 304. Also, the base of the optical deflector 309 having a triangle shape is arranged parallel to the lens 302.

If a beam is generated from the laser diode 301, the beam is converged in parallel by means of the lens 302. As an electrical signal is not applied to the optical deflector 309 positioned between the lens 302 and the diffraction grating 304, if the beam has the same refractive index to that of the surrounding part 310, there exists a first beam 307 of a specific wavelength among the beams generated from the laser diode 301, the first beam 307 is diffracted in the same direction to an incident direction by means of the diffraction grating and then returns to the laser diode 301. However, in case of a second beam 308 having a different wavelength, there is no resonating phenomenon as the second beams does not returns to the laser diode because the diffracting angle is different from the incident angle of the second beam. At this case, if the refractive index of the optical deflector 309 is controlled, the second beam 308 diffracted different from the incident angle by the diffraction grating 304 vertically passes through toward the base of the optical deflector 309. Accordingly, the second beam 308 passes through the lens 302 and returns to the laser diode 301, thus causing a resonating phenomenon and variations in the wavelength.

Figure 6:
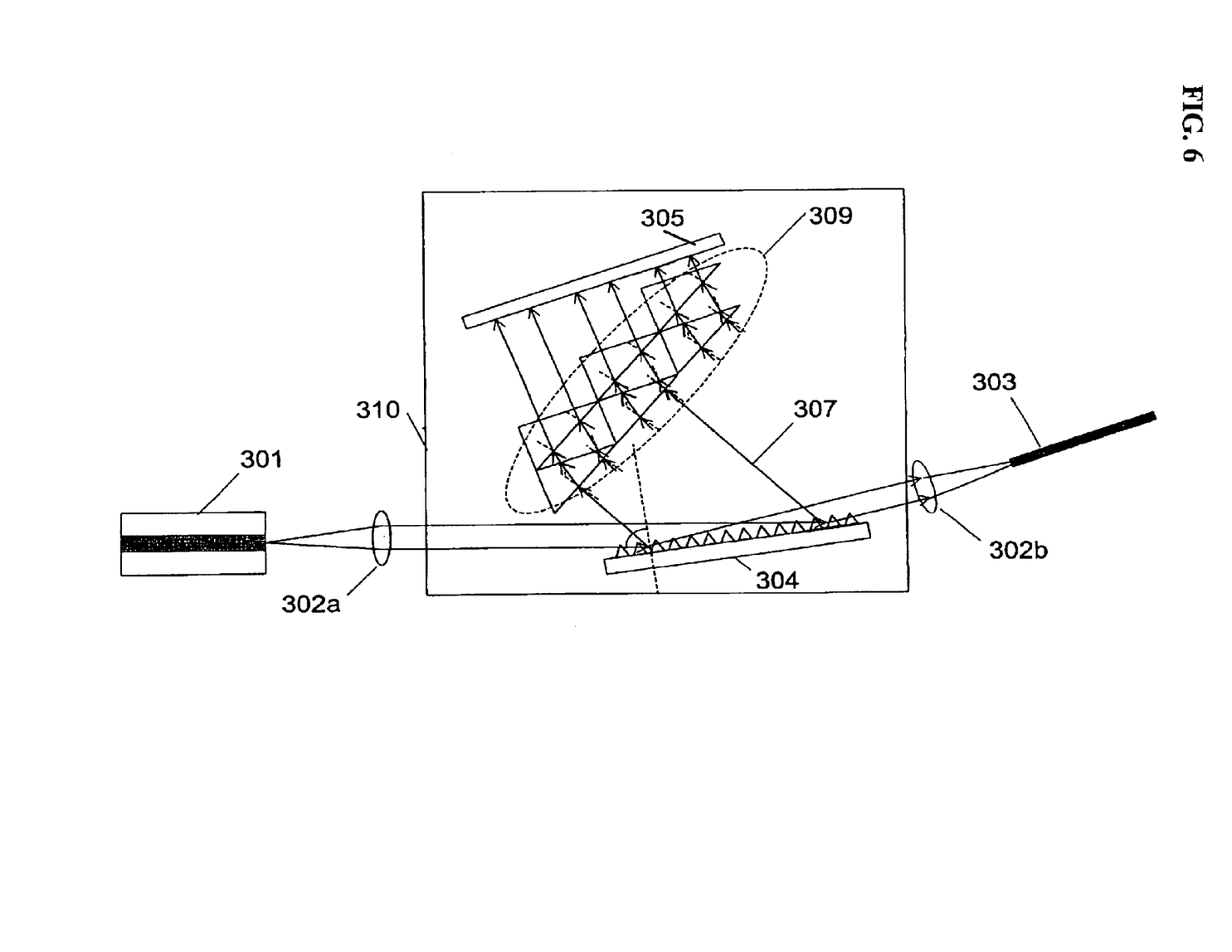
FIG. 6 shows a wavelength tunable external resonator using an optical deflector according to a third embodiment of the present invention.
Figure 7:
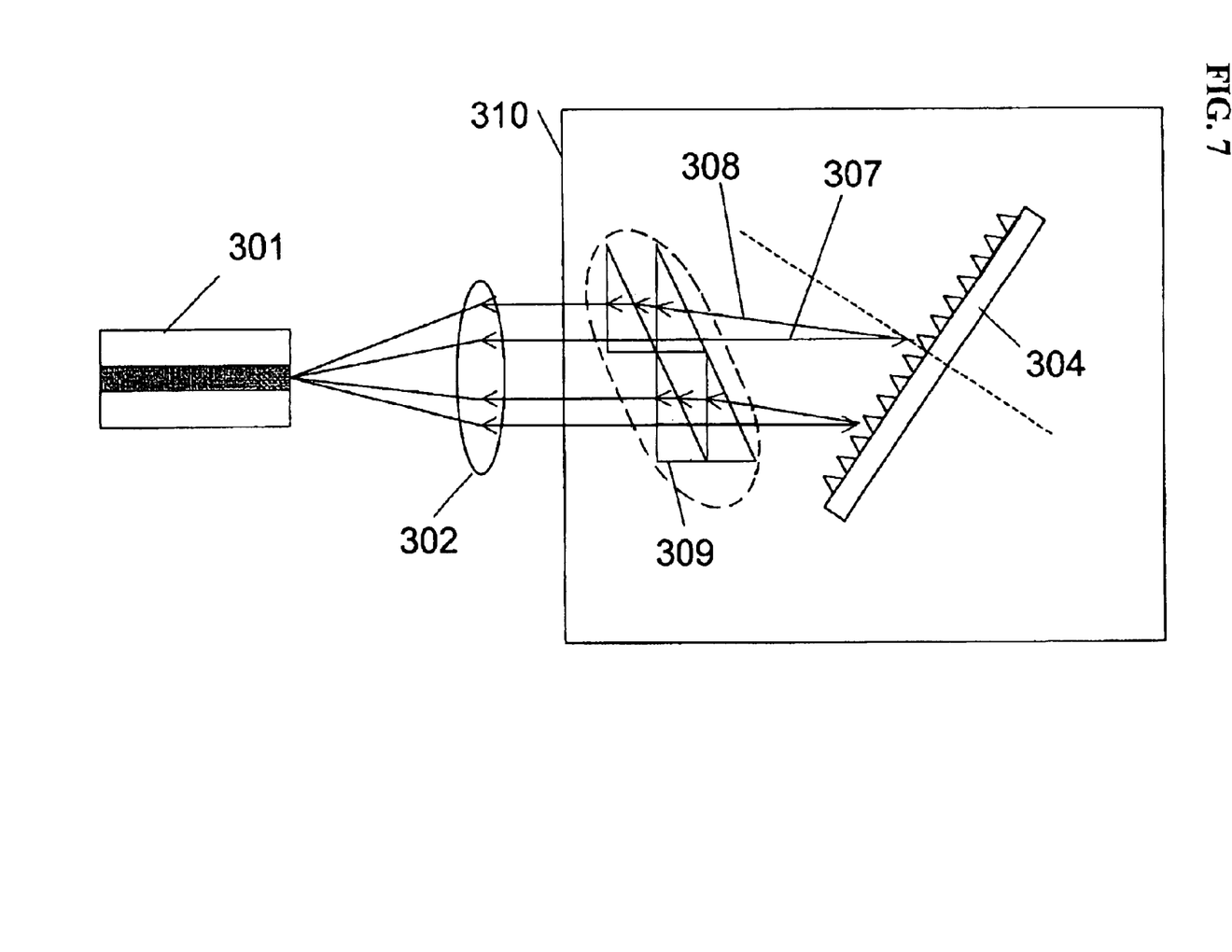
FIG. 7 shows a wavelength tunable external resonator using an optical deflector according to a fourth embodiment of the present invention.

In order to widen the variable range of the wavelength in the Littman-Metcalf and Littrow external resonators, it is required that the refractive index be sufficiently varied. However, due to a physical characteristic of a medium constituting the optical deflector, variations in the refractive index is theoretically limited to about 0.1. This physical limit can be overcome by arranging the optical deflector of a triangular shape in multiple stages, as shown in FIG. 6. Therefore, it is possible to construct the external resonator in a wide range of a wavelength. As above, the method of arranging the optical deflector of a triangular shape in multiple stages can be applied to the Littrow mode external resonator as well as the Littman-Metcalf mode external resonator, as shown in FIG. 7.

Figure 8:
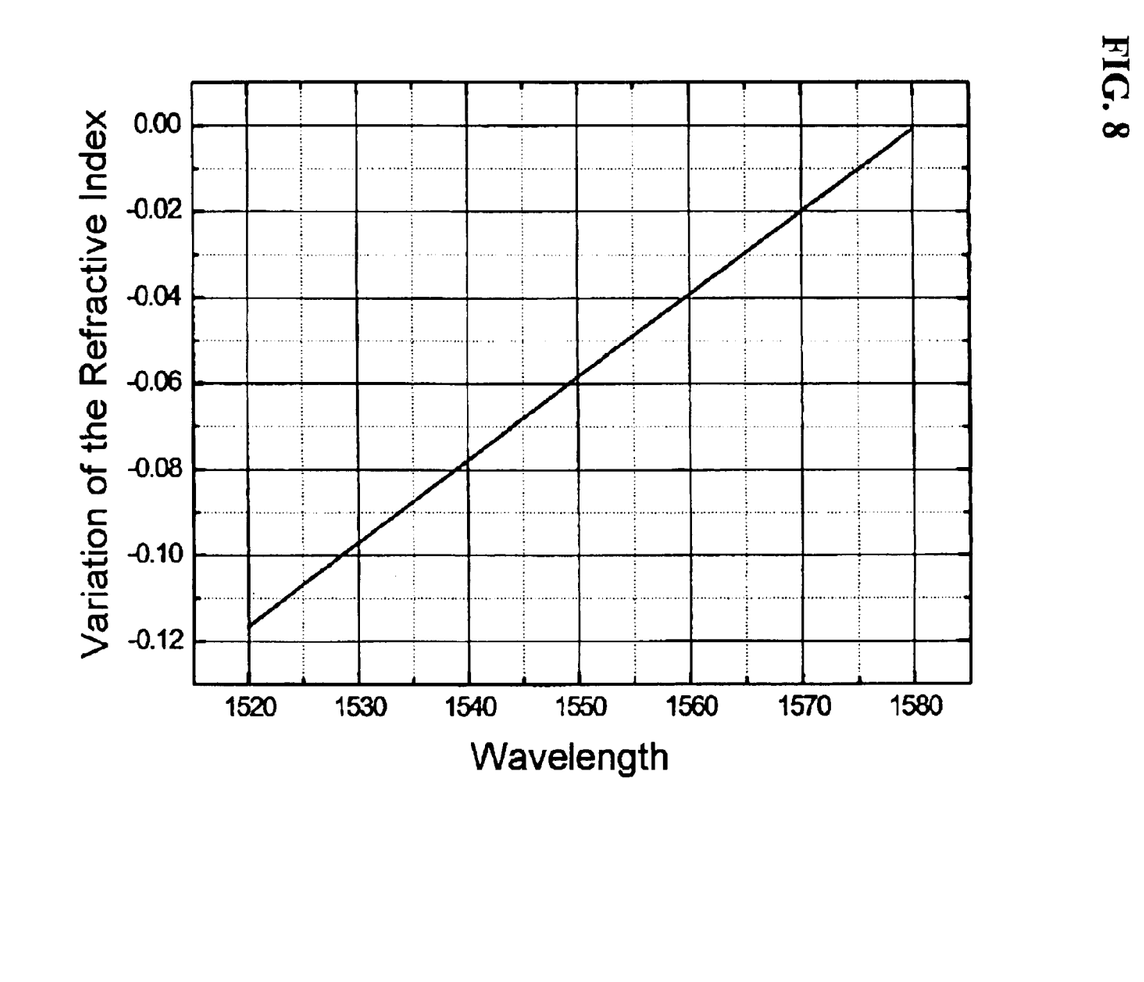
FIG. 8 is a characteristic graph illustrating the relationship of the wavelength of a beam to the refractive index in the external resonator shown in FIG. 8.

FIG. 8 is a characteristic graph illustrating the relationship of the wavelength of a beam to the refractive index in the external resonator shown in FIG. 4. More particularly, FIG. 8 shows a result of calculating the change in the amount of the refractive index necessary to tune the wavelength of a beam in the range of 1520~1580 nm when an InP/InGaAsP/InP slab waveguide is formed on a InP substrate to form a wavelength tunable external resonator shown in FIG. 4. As a major medium parameter used in calculating the refractive index, the degree of the diffracting grating is set to 1, the distance between the gratings is set to 1 µm and the incident angle of the parallel beam against the diffracting grating is set to 80°. The effective refractive index of the slab waveguide used is 3.27. Also, the vertical angle of the triangle (the vertical angle on the reflection mirror' side) in the optical deflector the refractive index of which is controlled by an electrical signal is set to 30°.

As shown in FIG. 8, as a result of calculation, it is required that variations in the refractive index be about 0.18 in order to have a variable range of 60 nm centering around the face 1550 nm. In case of an actual InP/InGaAsP/InP junction, however, it was known that the limit in variation in the amount of the refractive index due to control of the concentration of the carrier is theoretically about 0.1 and the refractive index of about 0.05 can be easily experimentally implemented. This physical limit can be overcome by arranging the optical deflector of a right-angled triangle shape in multiple stages to refract the beam in multiple, as explained in FIGS. 6 and 7. Therefore, the external resonator capable of easily tuning the wavelength in a wider range than the above can be implemented.

In the above, in case of FIG. 4, the base of the triangle of the optical deflector is positioned in parallel to the reflection mirror. Also, in case of FIG. 5, the base of the triangle of the optical deflector is positioned in parallel to the lens. At this time, only a beam having a specific wavelength among the beam passed through the optical deflector is vertically incident toward the reflection mirror or the lens depending on the refractive index controlled by an electrical signal. In this case, the beam having a specific wavelength is incident vertically from the base of the triangle of the optical deflector.

However, the refractive index is controlled in order that the beam having a specific wavelength among the beams passed through the optical deflector have the other angles except for a vertical direction from the base of the triangle of the optical deflector, it is possible to construct the resonator capable of the base of the optical deflector of not being positioned in parallel to the reflection mirror or the lens.

Figure 9:
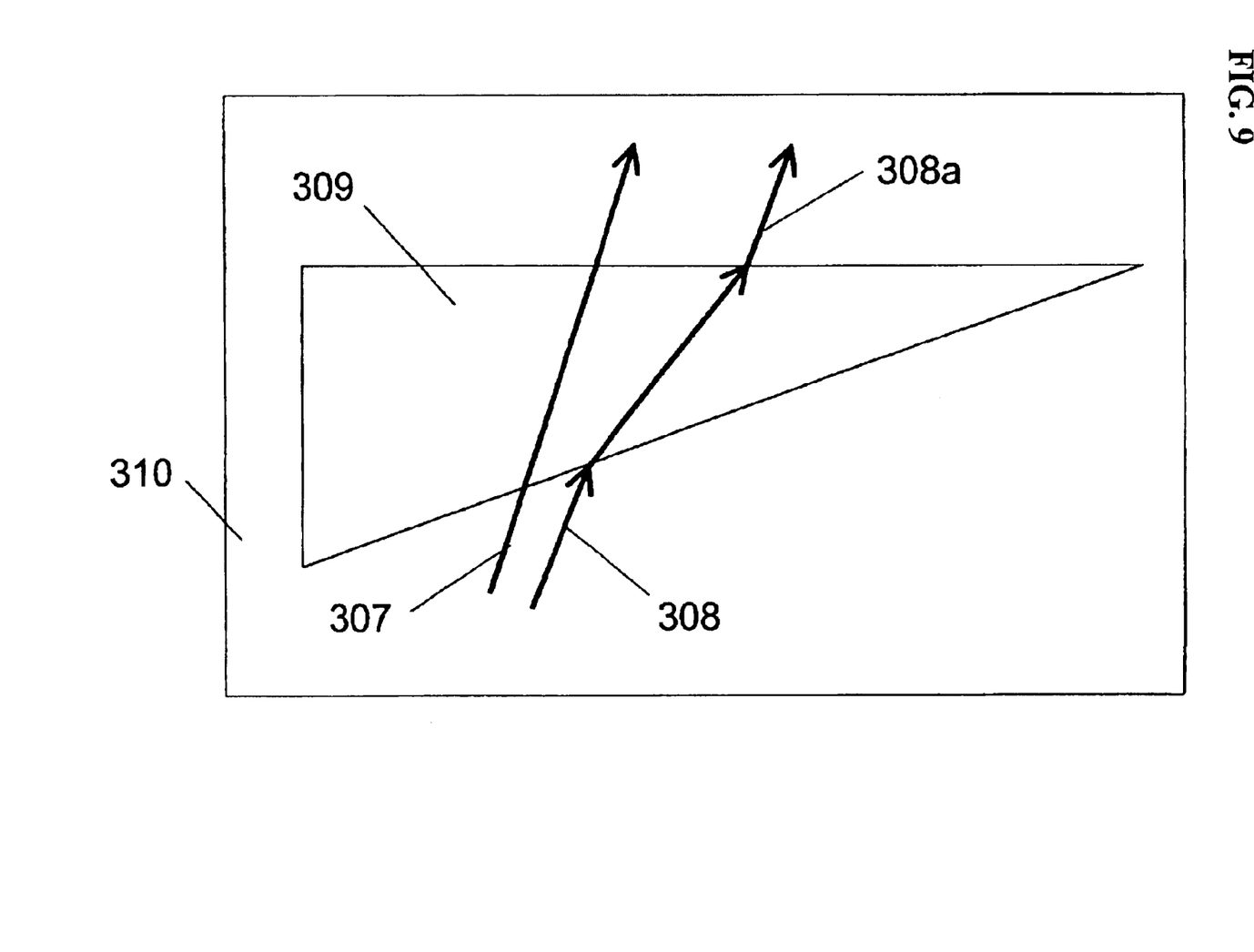
FIG. 9 is a conceptual diagram of an optical deflector a refractive index of which is control by an electrical signal, having a triangular structure.

FIG. 9 is a conceptual diagram of an optical deflector a refractive index of which is controlled by an electrical signal, having a triangular structure.

Referring to FIG. 9, the refractive index of the optical deflector 309 is controlled by applying an electrical signal. Thus, the beam 308 incident from the surrounding 310 having a different refractive index is refracted as an outgoing beam 308a having a given refractive angle from the base of the triangle according to Snell's law. Comparing the optical deflector shown in FIG. 9 with the optical deflector shown in FIG. 3, they are same in the operating principle to control the refractive index of the optical deflector 309 using an electrical signal but different in their refractive index of the outgoing beam 308a having a specific wavelength. In other words, the beam 307 having a specific wavelength does not go out vertically from the base of the rectangular of the optical deflector but goes out with a given angle. At this time, though not shown in the drawings, the base of the right-angled triangle of the optical deflector 309 is positioned to have a given angle against the reflection mirror (not shown) or the lens (not shown), so that the outgoing beam 307a refracted by a given angle is vertically incident toward the reflection mirror or the lens.

It will be described more detail by applying the above principle to the wavelength tunable external resonator in FIG. 4 as an example.

Figure 10:
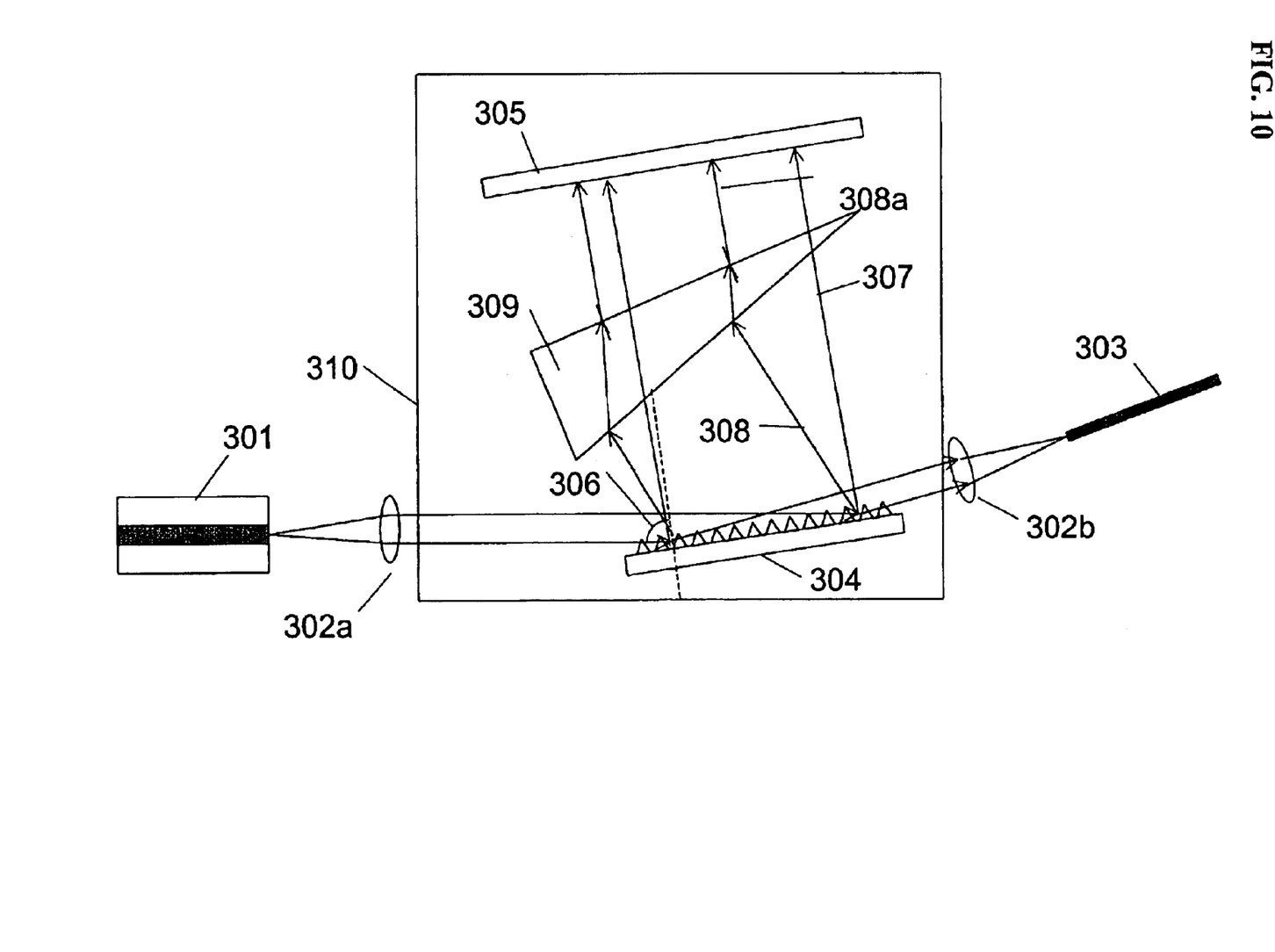
FIG. 10 shows a wavelength tunable external resonator using an optical deflector according to a fifth embodiment of the present invention.

FIG. 10 shows a wavelength tunable external resonator using an optical deflector according to a fifth embodiment of the present invention.

Referring to FIG. 10, a basic construction of the wavelength tunable external resonator according to a fifth embodiment of the present invention is same to that of the wavelength tunable external resonator shown in FIG. 4. In other words, the wavelength tunable external resonator includes a laser diode 301 having a wide wavelength band, a first lens 302a for making the beam from the laser diode 301 parallel, a diffraction grating 304 for diffracting the parallel beam, a reflection mirror 305 for reflecting the diffracted beam, and an optical deflector 309 of a triangle shape positioned between the reflection mirror 305 and the diffraction grating 304, for controlling the refractive index of the beam incident depending on an electrical signal.

In the above, the base of the triangle of the optical deflector 309 is obliquely positioned against the reflection mirror 305.

If a beam is generated from the laser diode 301, the beam is converged in parallel by means of the first lens 102a. Then, the parallel beam is diffracted toward the reflection mirror 305 by means of the diffracting grating 304. In case that the refractive index of the optical deflector 309 is same to the surrounding part 310 since an electrical signal is not applied thereto, the beam is vertically incident to the reflection mirror 305 same to the case in FIG. 4. Next, the beam is reflected and then passes through the diffracting grating 304 to return to the laser diode 301. Thus, there exist a resonating phenomenon caused by the first beam 307.

At this case, as the base of the optical deflector 309 and the reflection mirror 305 are parallel in FIG. 4, the first beam 307 goes out vertically from the base. In FIG. 10, however, as the base of the optical deflector 309 is obliquely positioned against the reflection mirror 305, the first beam 307 goes out in other directions except for vertical direction from the base of the optical deflector 309 but is vertically incident toward the reflection mirror 305. Therefore, considering the angle between the optical deflector 309 and the reflection mirror 305, the first beam 307 is made to go out at a given angle from the base of the optical deflector 309 and then to be incident vertically toward the reflection mirror 305.

For a second beam 308 having a different wavelength from the first beam 307 among the beam incident to the reflection mirror 305 not a vertical direction, an electrical signal applied to the optical deflector 309 is controlled to change the refractive index, so that the outgoing beam 308a can be incident vertically to the reflection mirror. At this case, the second beam 308 is diffracted by the diffracting grating 304 and then returns to the laser diode 301 via the first lens 302a. Thereby, as the second beam 308 selectively returns to the laser diode 301, a resonating operation can be performed.

As a result, a beam having a specific wavelength can be refocused on the laser diode 301 by applying an electrical signal to the optical deflector 309 considering the angle between the optical deflector 309 and the reflection mirror 305 even though the optical deflector 309 is not positioned in parallel to the reflection mirror 305. Also, as a beam having a different wavelength is focused consecutively by controlling the electrical signal, the wavelength can be varied.

It should be noted that the wavelength tunable external resonator using the optical deflector shown in FIG. 10 can be applied to the Littrow mode external resonator as well as the Littman-Metcalf mode external resonator.

Figure 11:
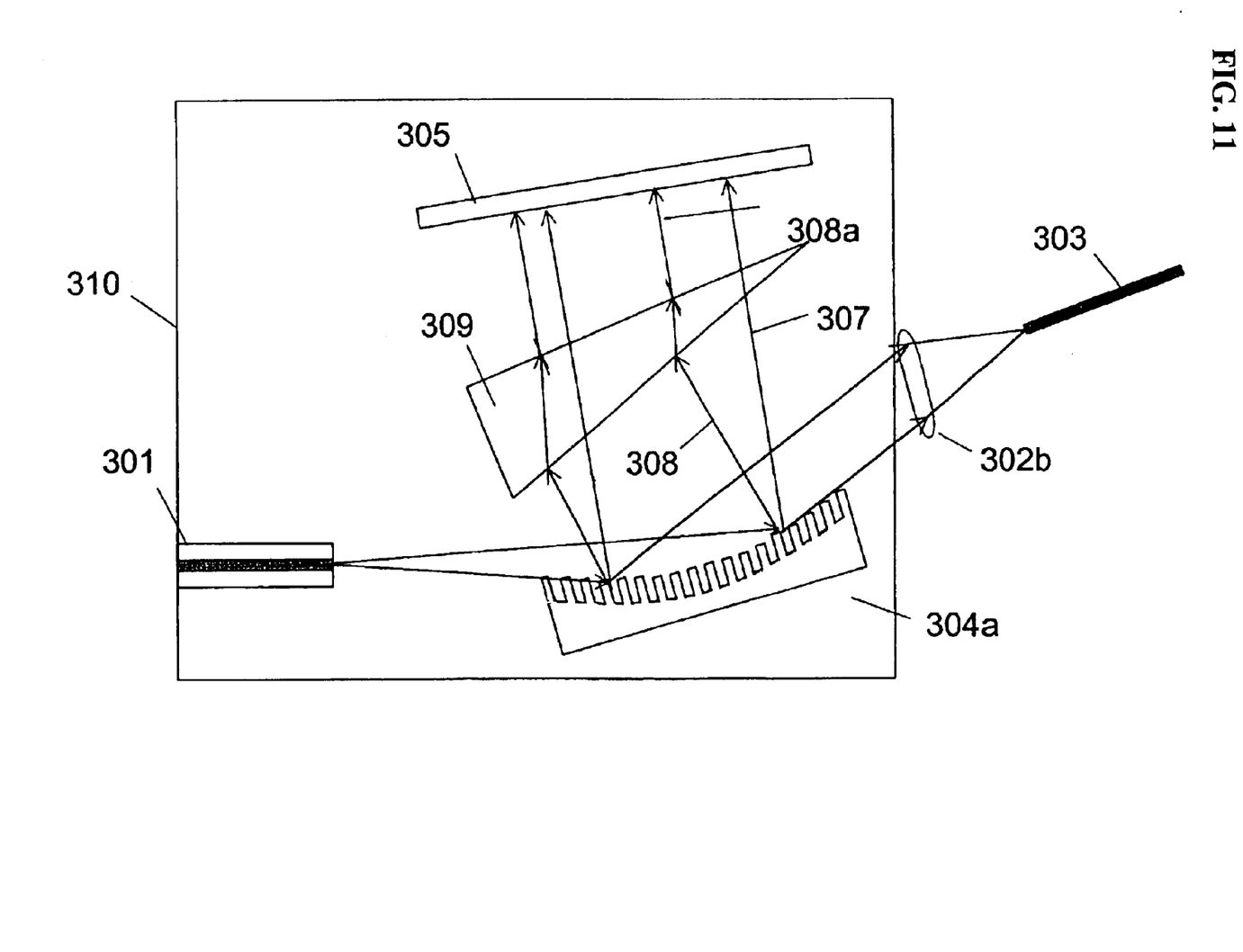
FIG. 11 shows a wavelength tunable external resonator using an optical deflector according to a sixth embodiment of the present invention.

FIG. 11 shows a wavelength tunable external resonator using an optical deflector according to a sixth embodiment of the present invention.

Referring now to FIG. 11, a basic construction of the wavelength tunable external resonator according to a sixth embodiment of the present invention is same to that of the wavelength tunable external resonator shown in FIG. 10, except that the diffraction grating 304 of a straight line is substituted by the diffraction grating 304a of a concave shape and the lens 302a is removed to make a light parallel. In other words, the wavelength tunable external resonator includes the laser diode 301 having a wide wavelength band, the diffraction grating 304a of a concave shape for making a beam from the laser diode 301 a parallel beam and focusing reflecting components being 0 degree diffraction, the reflection mirror 305 for reflecting the diffracted beam, and an optical deflector 309 of a triangle shape positioned between the reflection mirror 305 and the diffraction grating 304, for controlling the refractive index of the beam incident depending on an electrical signal.

In FIG. 11, it could be seen that the lens (302a in FIG. 10) positioned between the diffraction grating 304a of a concave shape and the laser diode 301 is removed from the external resonator shown in FIG. 11. Thus, as the number of component constituting the external resonator is reduced, there are advantages that the manufacturing process and cost can be reduced. Further, there is an advantage that the diffraction grating 304a of a concave shape, the reflection mirror 305 and the optical deflector 309 can be easily integrated on a semiconductor substrate constituting the laser diode 301. In other words, a Fabry-Perot semiconductor laser made of InP or GaAs series can be integrated on a semiconductor slab waveguide substrate of the same series using crystal growth technology, etch technology, metal deposition technology, etc. Then, the reflection mirror, the diffracting grating of a concave shape and the optical deflector can be formed on the slab waveguide portion using etch technology and metal deposition technology, so that they can be integrated on a single chip.

It should be noted that the wavelength tunable external resonator using the optical deflector shown in FIG. 11 could be applied to the Littrow mode external resonator as well as the Littman-Metcalf mode external resonator.

As mentioned above, according to the present invention, a wavelength satisfying the resonating condition to a specific wavelength using an optical deflector the refractive index of which is varied depending on an electrical signal and through control of the electrical signal with a reflection mirror and a diffraction grating fixed, is varied. Therefore, the present invention has an advantage that it can construct a light source capable of stably and consecutively varying the wavelength.

Further, if the wavelength tunable external resonator is constructed using an InP/InGaAsP/InP slab waveguide, the variation speed determined by the lifetime of a carrier is raised to below ns and reliability. Further, the manufacturing cost can be significantly reduced while miniaturizing the size of the apparatus and simplifying the manufacturing process.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A wavelength tunable external resonator capable of tuning a wavelength using an electrical signal, comprises:
   a light source for emitting beams of the plurality of wavelengths;
   a lens for making the beams from the light source in parallel;
   a diffraction grating for diffracting the parallel beams;
   a reflection mirror for reflecting incident beams; and
   an optical deflector positioned between said diffraction grating and said reflection mirror, for changing the direction of the diffracted beams from said diffraction grating by controlling the refractive index of the optical deflector depending on an application of the electrical signal, and then making beams of a specific wavelength propagate perpendicularly to said reflection mirror,
   wherein beams perpendicularly reflected by said reflection mirror are focused on said light source,
   and wherein said optical deflector comprises a slab-waveguide and a triangle shape portion of a p/n junction in a slab waveguide, wherein if a beam traveling through the slab waveguide passes through the triangle shape portion of the p/n junction, a refractive angle of the beam is controlled by variations in the refractive index, depending on variations in the density of a carrier in the slab wave guide by injection of current or application of voltage into/to the p/n junction.

2. The wavelength tunable external resonator as claim 1, wherein said slab waveguide is formed using materials such as InP or GaAs.

3. The wavelength tunable external resonator in claim 1, wherein said light source is a Fabry-Perot semiconductor laser.

4. The wavelength tunable external resonator as claimed in claim 1, wherein said optical deflector is positioned in multiple stages between said diffraction grating and said reflection mirror, so that a beam having a specific wavelength is refracted more than one time to increase the tunable range.

5. A wavelength tunable external resonator capable of tuning a wavelength using an electrical signal, comprises:
   a light source for emitting beams of the plurality of wavelengths;
   a lens for making the beams in parallel;
   a diffraction grating for diffracting incident beams;

a reflection mirror for reflecting incident beams; and an optical deflector positioned between said lens and the diffraction grating, for changing the direction of the parallel beams incident on said diffraction grating by controlling the refractive index of the optical deflector depending on an application of the electrical signal, and then making beams of a specific wavelength propagate perpendicularly to said reflection mirror, wherein beams perpendicularly reflected by said reflection mirror are focused on said light sources and wherein said optical deflector comprises a slab waveguide and a triangle shape portion of a p/n junction in the slab waveguide, wherein if a beam traveling through the slab waveguide passes through the triangle shape portion of the p/n junction, a refractive angle of the beam is controlled by variations in the refractive index, depending on variations in the density of a carrier in the slab waveguide by injection of current or application of voltage into/to the p/n junction.

6. The wavelength tunable external resonator as claim 5, wherein said slab waveguide is formed using maters such as InP or GaAs.

7. The wavelength tunable external resonator in claim 5, wherein said light source is a Fabry-Perot semiconductor laser.

8. The wavelength tunable external resonator as claimed in claim 5, wherein said optical deflector is positioned in multiple stages between said lens and said diffraction grating, so that a beam having a specific wavelength is refracted more than one time to increase the tunable range.

9. A wavelength tunable external resonator capable of tuning a wavelength using an electrical signal, comprises:

a light source for emitting beams of various wavelengths;

a diffraction grating of a concave shape for diffracting the emitted light to a parallel light;

a reflection mirror for reflecting the incident beams;

a lens for focusing the beams incident in parallel in the diffraction grating of the concave shape on an optical fiber; and an optical deflector positioned between said diffraction grating of the concave shape and said reflection mirror, for changing the direction of parallel incident beams from the diffraction grating by controlling the refractive index of the optical deflector depending on the application of the electric signal, and then making a beam of a specific wavelength propagate perpendicularly to the reflection mirror, wherein the beams perpendicularly reflected by said reflection mirror are focused on said source, and wherein said optical deflector comprises a slab waveguide and a triangle shape portion of a p/n junction in the slab waveguide, wherein if a beam traveling through the slab waveguide passes through the triangle shape portion of the p/n junction, a refractive angle of the beam is controlled by variations in the refractive index, depending on variations in the density of a carrier in the slab waveguide by injection of current or application of voltage into/to the p/n junction.

10. The waveguide tunable external resonator as claim 9, wherein said slab waveguide is formed using materials such as InP or GaAs.

11. The wavelength tunable external resonator in claim 9, wherein said light source is a Fabry-Perot semiconductor laser.

12. The wavelength tunable external resonator as claimed in Claim 9, wherein said optical deflector is positioned in multiple stages between said diffraction grating and said reflection mirror, so that a beam having a specific wavelength is refracted more than one time to increase the tunable range.

13. A wavelength tunable external resonator capable of tuning a wavelength using an electrical signal, comprises:

a light source for emitting beams of a plurality of wavelengths;

a lens for making the beams in parallel;

a diffraction grating for diffracting incident beams; and an optical deflector positioned between said lens and the diffraction grating, for changing the direction of the parallel beams by controlling a refractive index of the optical deflector depending on an application of the electric signal, and then making beams of a specific wavelength diffracted by the diffraction grating returned parallel to the lens in an opposite direction, wherein the beams of a specific wavelength returned parallel to the lens in the opposite direction are focused, and wherein said optical deflector comprises a slab waveguide and a triangle shape portion of a p/n junction in the slab waveguide, wherein if a beam traveling through the slab waveguide passes through the triangle shape portion of the p/n junction, a refractive angle or the beam is controlled by variations in the refractive index, depending on variations in the density of a carrier in the slab waveguide by injection of current or application of voltage into/to the p/n junction.

14. The wavelength tunable external resonator as claim 13, wherein said slab waveguide is formed using materials such as InP or GaAs.

15. The wavelength tunable external resonator in claim 13, wherein said light source is a Fabry-Perot semiconductor laser.

16. The wavelength tunable external resonator as claimed in claim 13, wherein said optical deflector is positioned in multiple stages between said lens and said diffraction grating, so that a beam having a specific wavelength is refracted more than one time to increase the tunable range.

\* \* \* \* \*